United States Patent [19]

Palombo

[11] Patent Number: 5,253,260
[45] Date of Patent: Oct. 12, 1993

[54] APPARATUS AND METHOD FOR PASSIVE HEAT PIPE COOLING OF SOLID STATE LASER HEADS

[75] Inventor: Mario P. Palombo, Manhattan Beach, Calif.

[73] Assignee: Hughes Aircraft Company, Los Angeles, Calif.

[21] Appl. No.: 812,505

[22] Filed: Dec. 20, 1991

[51] Int. Cl.$^5$ ............................................. H01S 3/04
[52] U.S. Cl. ..................................... 372/34; 372/35; 372/36; 372/43; 372/50
[58] Field of Search ................... 372/34, 35, 36, 43, 372/44, 50; 257/706, 713, 712, 714, 715, 717, 723

[56] References Cited

U.S. PATENT DOCUMENTS

| | | | |
|---|---|---|---|
| 3,619,808 | 11/1971 | Tomkins | 372/35 |
| 3,784,929 | 1/1974 | Joy, Jr. et al. | 372/35 |
| 4,003,074 | 1/1977 | Yonezu et al. | 372/36 |
| 4,232,276 | 11/1980 | Iwata | 372/35 |
| 4,637,028 | 1/1987 | Kahan | 372/34 |
| 4,673,030 | 6/1987 | Basiulis | 165/32 |
| 4,791,634 | 12/1988 | Miyake | 372/34 |
| 5,031,184 | 7/1991 | Greve et al. | 372/34 |
| 5,084,886 | 1/1992 | Martin | 372/36 |
| 5,105,429 | 4/1992 | Mundinger et al. | 372/36 X |
| 5,181,214 | 1/1993 | Berger et al. | 372/36 X |
| 5,195,102 | 3/1993 | McLean et al. | 372/36 X |

OTHER PUBLICATIONS

"Variable Conductance Heat Pipe Technology for Precise Temperature Control of the NASA/DDLT Transmitter" by D. E. Vanevenhoven and D. Antoniak, presented in SPIE vol. 1044 *Optomechanical Design of Laser Transmitters and Receivers* (1989), pp. 135–144.

*Primary Examiner*—Brian Healy
*Attorney, Agent, or Firm*—Michael W. Sales; Wanda K. Denson-Low

[57] ABSTRACT

In a solid state laser assembly (12), arrays (60) of pumping laser diode bars (62), placed on opposed sides of a laser rod (36), are maintained at an optimal operating temperature by a pair of heat pipes (16) physically and thermally coupled at their respective evaporator sections (18) to both the diode bars and the laser rod. The laser assembly includes a pump cavity (34) configured as an I-beam having two pairs of terminal interfaces (58) respectively bounding a pair of elongated U-shaped channels (48). Heat from laser rod (36) is conducted through pump cavity (34) to the heat pipe evaporator sections (18). A mounting block (64) physically and thermally supports each of the diode array assemblies for spreading heat therefrom also to the evaporator sections.

15 Claims, 4 Drawing Sheets

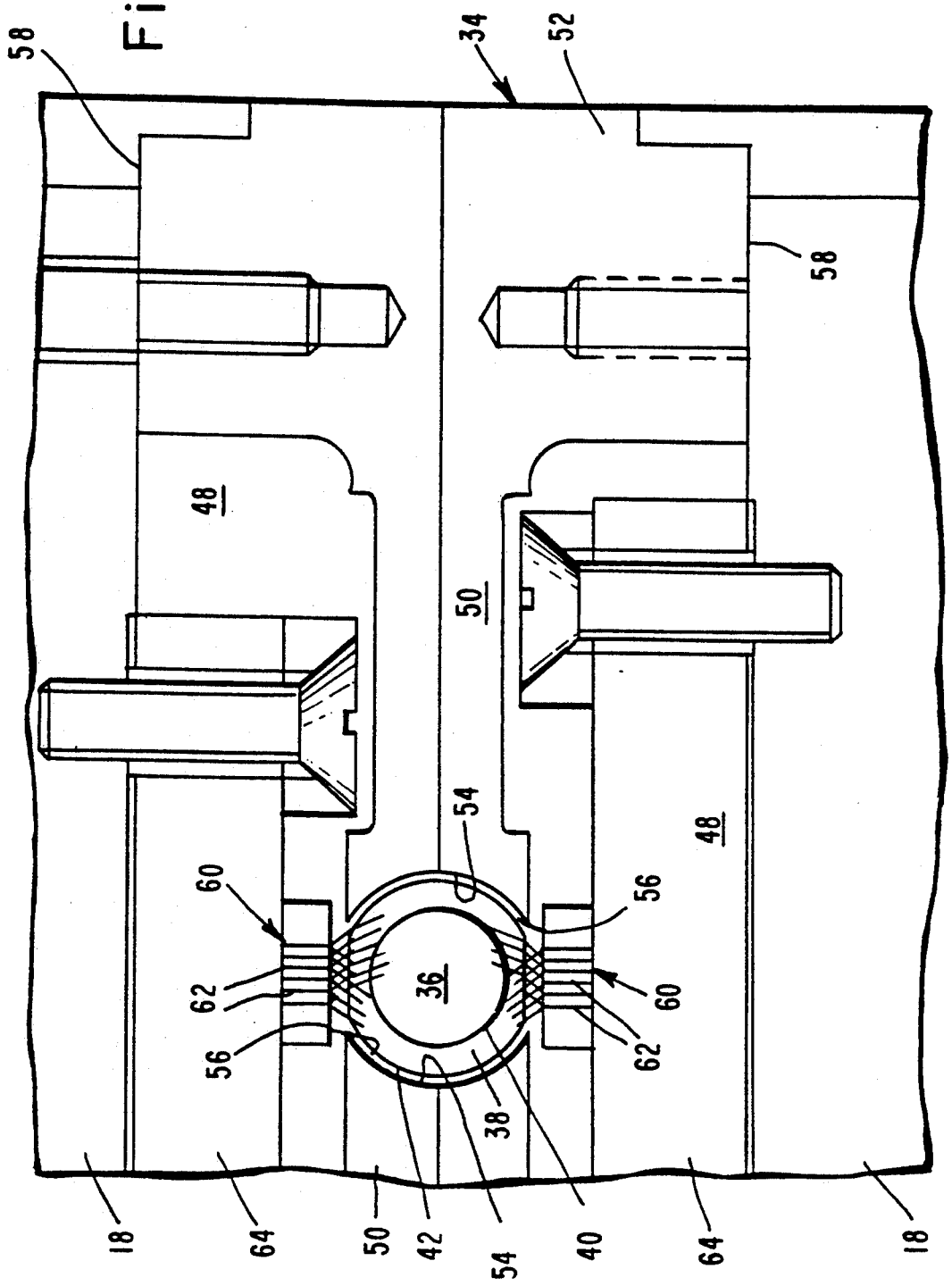

APPARATUS AND METHOD FOR PASSIVE HEAT PIPE COOLING OF SOLID STATE LASER HEADS

BACKGROUND OF THE INVENTION

This invention was made with Government support under contract F33615-90-C-1504 awarded by the Department of the Air Force. The Government has certain rights in this invention.

1. FIELD OF THE INVENTION

The present invention relates to cooling of solid state lasers and, more particularly, to passive cooling of such lasers by fixed and/or variable conductance heat pipes.

2. DESCRIPTION OF RELATED ART AND OTHER CONSIDERATIONS

The removal of heat, generated in the course of stimulating coherent emission from a laser device, can be effected through the use of any one of many conventional active and passive cooling methods and implementations, and is dependent upon the specific type of laser to be cooled and the environment in which it is to be used. The present invention is directed specifically to solid state lasers which are pumped by such pumping means as laser amplifier diodes and flash lamps. Because the preferred pumping implementation comprises laser diodes used in combination with a solid state laser, the following discussion will be specifically directed to this combination. However, it is to be understood that the present invention is not intended to be limited to this specific combination, but to a combination of a solid state laser and pumping means therefor.

In general, types of thermal management systems include liquid cooling, conduction cooling (e.g., by a metal strap), heat pump cooling (e.g., by a thermoelectric cooler), vapor phase refrigeration, and heat pipe cooling. Each has its advantages and disadvantages.

While liquid cooling can provide a low incremental temperature, it is complex, has moving parts, consumes power, is susceptible to clogging and, therefore, is unreliable, and requires active temperature control.

The major attractions of the conductive cooling technique is its simplicity, as not having any moving parts, and its reliability. However, it is heavy and thus unsuitable such as for use in air or space borne vehicles. It cannot be readily packaged in different configurations, and is limited to conduction from fixed points. Auxiliary heating and cooling control is required.

The heat pump or thermoelectric cooler is compact and lightweight, but consumes power and requires active temperature control.

The major advantage of the vapor phase refrigerator is its ability to handle large differential temperatures. However, it is heavy, large and inefficient. Its reliability is questionable, as being subject to leaks. Like all of the above techniques, active temperature control is required.

Fixed and variable conductance heat pipes are passive and efficient; therefore, active temperature control is not required. They are reliable, lightweight, compact and have no moving parts. In recognition thereof, they have been used directly with space based laser diode transmission, see, e.g., "Variable Conductance Heat Pipe Technology for Precise Temperature Control of the NASA/DDLT Transmitter" by D. E. Vanevenhoven and D. Antoniak, presented in SPIE Vol. 1044 *Optomechanical Design of Laser Transmitters and Receivers* (1989), pages 135-144. As explained therein, the temperature of a laser diode transmitter must be precisely controlled to maintain its transmitting frequency stable. Such control was obtained by use of a variable conductance heat pipe placed between the laser diode and the radiator to shut off heat flow with a very small drop in laser diode temperature. This was said to eliminate costly heater power consumption, to provide tight control of temperature and to reduce space radiator size, in replacement of a conventional thermostatically controlled heating system.

SUMMARY OF THE INVENTION

The present invention recognizes the advantages and disadvantages of the above-described mechanisms, and improves upon them.

In general, a solid state laser assembly, which includes the combination of a laser pumping device positioned adjacent to a laser rod, is maintained at an operating temperature by at least one heat pipe thermally coupled to both the pumping device and the laser rod assembly for removing heat therefrom.

In the preferred embodiment, the laser assembly includes a pump cavity configured as an I-beam having two pairs of terminal faces respectively bounding a pair of elongated U-shaped channels. The preferred pumping means comprises a plurality of laser diode arrays which comprise diode bars and which are assembled into two groups. The diode array groups are placed on opposed sides of the laser rod. A pair of heat pipe assemblies are physically and thermally secured at their evaporator sections respectively both to the mounting block of the diode array assemblies and to the pairs of terminal interfaces. Each diode array mounting block physically and thermally supports each diode array assembly for spreading heat therefrom to its evaporator section. Heat is thus removed from the laser rod through the pump cavity to the heat pipe assemblies, and from the diodes also to the heat pipe assemblies.

Several advantages are derived from this arrangement. Both the solid state laser rod and its pumping medium are passively cooled, while the pumping medium is maintained at its optimum operating temperature. Because passive cooling requires no power therefor, the overall efficiency of the system is improved. No moving parts are needed. Adjustment to changes in external temperatures over even a broad range is automatic. The heat pipe design is relatively simple, and thereby enhances system reliability and efficiency.

Other aims and advantages, as well as a more complete understanding of the present invention, will appear from the following explanation of an exemplary embodiment and the accompanying drawings thereof.

BRIEF DESCRIPTION OF THE DRAWINGS

FIG. 7 is cross-section of the laser head taken along line 7—7 of FIG. 6; and

DETAILED DESCRIPTION OF THE PREFERRED EMBODIMENTS

Figure 1:
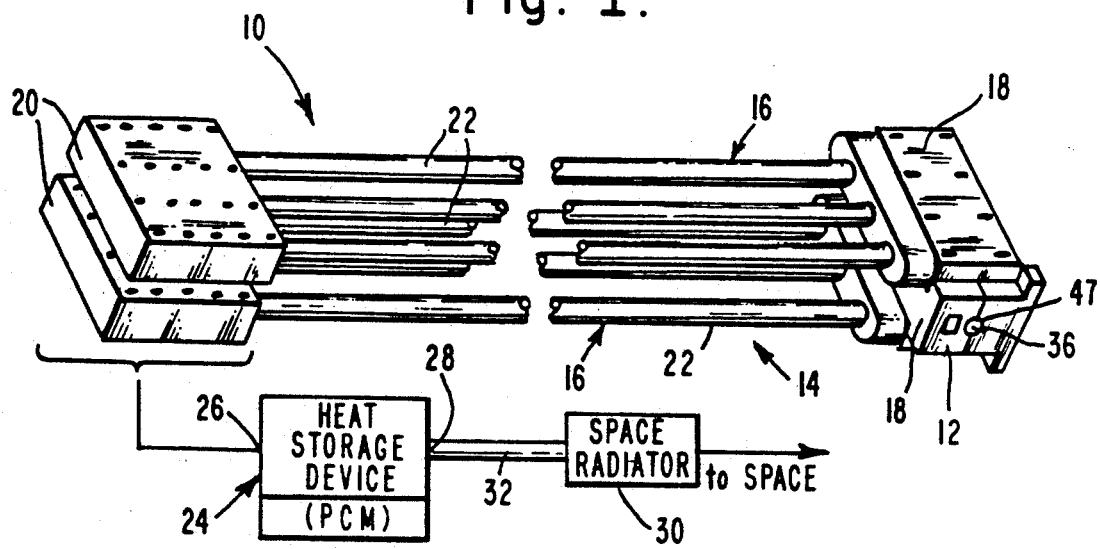
FIG. 1 is a perspective view of the present invention embodied as a passively cooled solid state laser head utilizing a heat pipe cooling arrangement, which may include, if desired, a space radiator.

FIG. 1 illustrates an assemblage 10 of a passively cooled solid state laser head 12 and a heat pipe cooling arrangement therefor generally denoted by indicium 14. Heat pipe cooling arrangement 14 includes at least one heat pipe cooling mechanism defined, preferably, as a pair of heat pipe assemblies 16.

Figure 2:
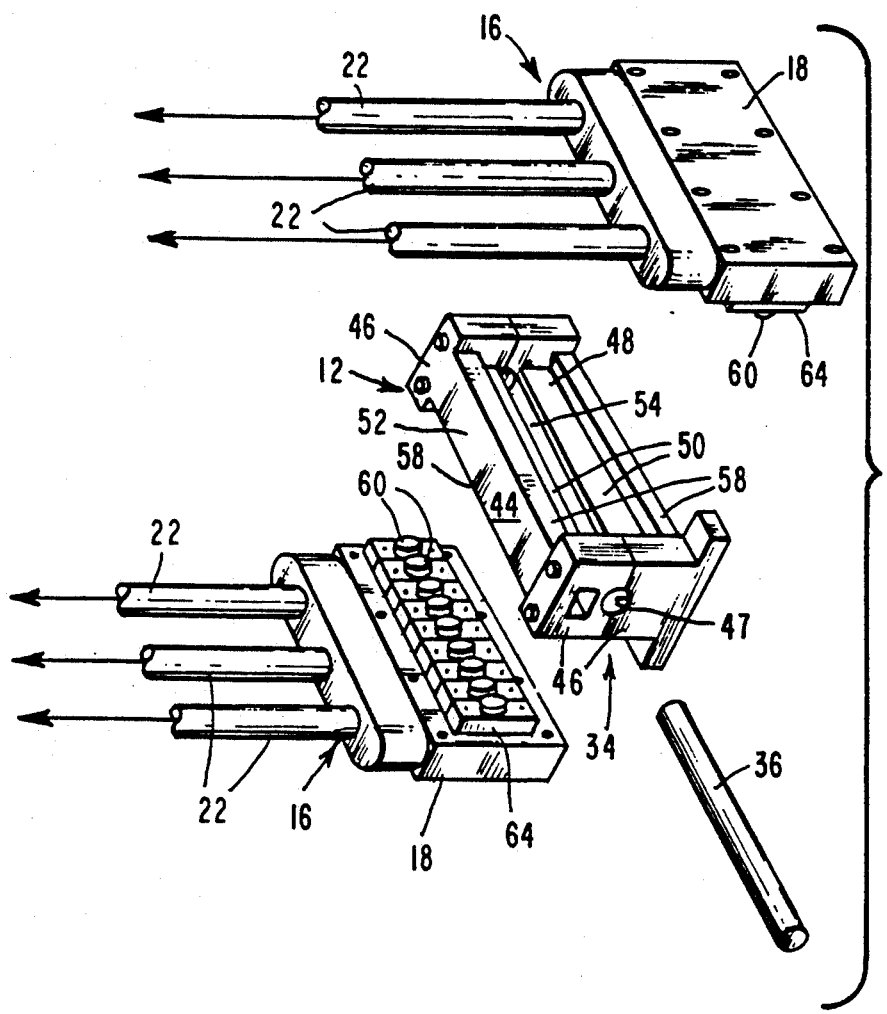
FIG. 2 is an exploded and enlarged perspective view of the laser head and the evaporative end of the heat pipe assembly depicted in FIG. 1.
Figure 3:
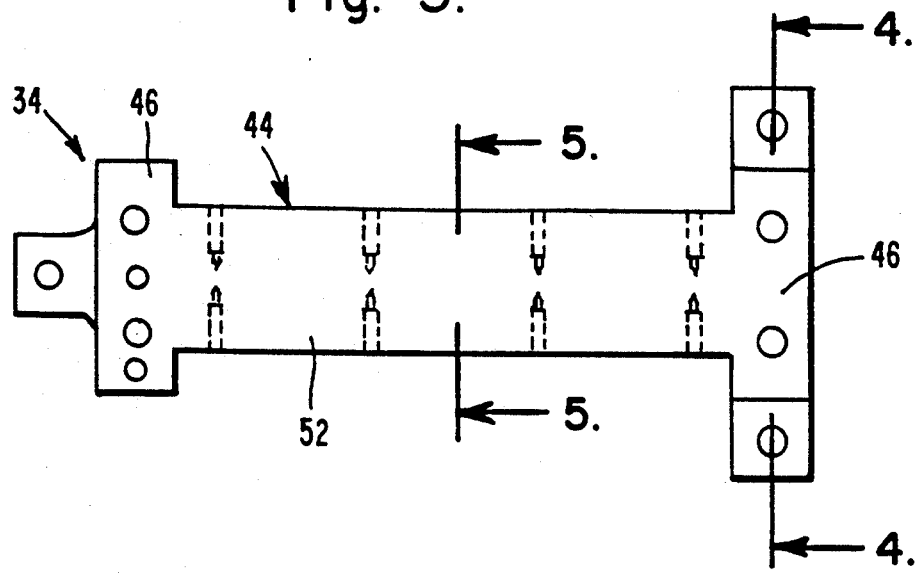
FIG. 3 is a top view of the pump cavity housing portion of the laser head shown in FIG. 2.
Figure 4:
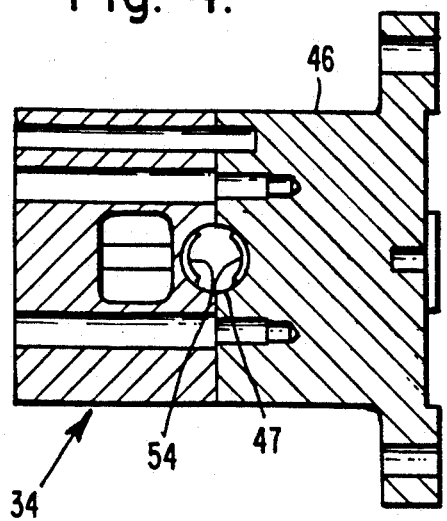
FIG. 4 is a cross-sectional view of the pump cavity housing taken along line 4-4 of FIG. 3.
Figure 5:
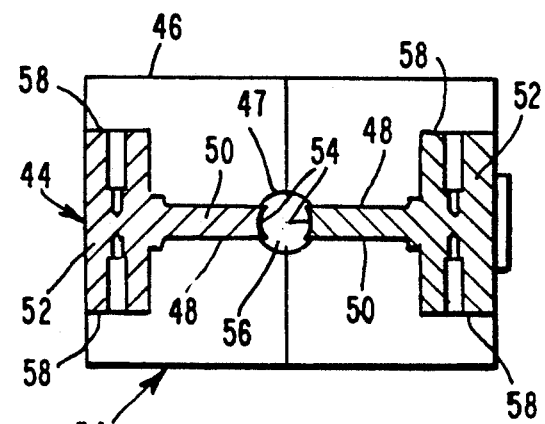
FIG. 5 is a cross-sectional view of the pump cavity housing taken along line 5—5 of FIG. 3.

As to be more fully described herein, see also FIG. 2, laser head 12 includes a laser rod 36 and a pumping medium, such as an array 60 of laser diode bars 62 (shown in FIG. 7) or a flash lamp. To obtain efficient pumping of the laser rod, the output wavelength of the pumping medium must be controlled within a specified range; otherwise, the pumping efficiency will be adversely affected.

Heat pipe assemblies 16 are of conventional design and each may comprise a fixed or a variable conductance type having evaporator and condenser portions 18 and 20 coupled together by an adiabatic portion 22. Each heat pipe assembly 16 is thermally coupled to laser head 12 at its evaporator portion 18 in order that heat, which is generated by the laser head, can be transferred through its condenser portion 20 to a heat sink. The thermal connection to the heat sink may be direct or indirect, depending upon the environment in which the present invention is to be used.

For space or flight applications, heat pipe cooling arrangement 14 and the heat sink connection have the following preferable construction. Assemblies 16 utilize fixed conductance heat pipes. The heat sink connection comprises the use of a heat storage device 24 thermally coupled at one side 26 to condenser sections 20 of heat pipe assemblies 16 and at its other side 28 to a space radiator 30 through a variable conductance heat pipe 32. Heat storage device 24 includes a phase change material (PCM). The use of phase change material in combination with heat pipe structures is discussed, for example, in U.S. Pat. No. 4,673,030.

In such space and flight applications, heat pipe assemblies, embodied as fixed conductance heat pipes, connect laser head 12 and any associated electronics and, if desired, other heat generating components to heat storage device 24, which thereby acts as a dedicated heat capacitor. Variable conductance heat pipe 32 is then used to connect storage device 24 to space radiator 30 or other suitable heat sink. This arrangement limits the temperature variation at laser head 12 and, most importantly, its laser diode bars 62 for reasons given below, to a variation of a few degrees-while the ambient temperature at radiator 30 can vary over a wide range, e.g., from the heat of the sun to the cold of space.

Specifically, when the temperature exterior to laser head 12 is greater than its temperature, heat therefrom is conducted to heat storage device 24 containing the phase change material (PCM), which absorbs the heat. When the exterior temperature is lower than that of the laser head, heat will be removed both from the laser head and from the heat storage device and the phase change material therein.

It is important that diode arrays 60 be operated at a junction temperature, e.g., of 70° C., which is defined as the actual temperature at the emitting diode surface. It is this temperature which controls the output wavelength of the diode array which, in turn, controls the laser pumping efficiency. Studies show that the diode temperature variation should be restricted to $\pm 10°$ C. to limit the wavelength variation of the diode output to about 3 nanometer. Accordingly, because the temperature of the diode junction must be controlled to within several degrees, the temperature of heat storage device 24 is also restricted to the same range. This result is accomplished by using a fixed capacitance heat pipe as each assembly 16 between laser head 12 and heat storage device 24. However, because the surface temperature of space radiator 30 may differ from that of heat storage device 24 over a period of time, variable conductance heat pipe 32 is used to maintain a relatively constant temperature of heat storage device 24 and, therefore, of the diode junction.

Reference is now made to the details of the present invention, as illustrated in FIGS. 2–7. As shown in FIG. 2, laser head 12 includes a two piece laser pump cavity housing 34 which supports a laser rod 36, for example a Nd:YLF (neodymium-yttrium lithium fluoride) laser rod. Housing 34 is formed from any suitable thermally conductive material, such as aluminum.

Figure 6:
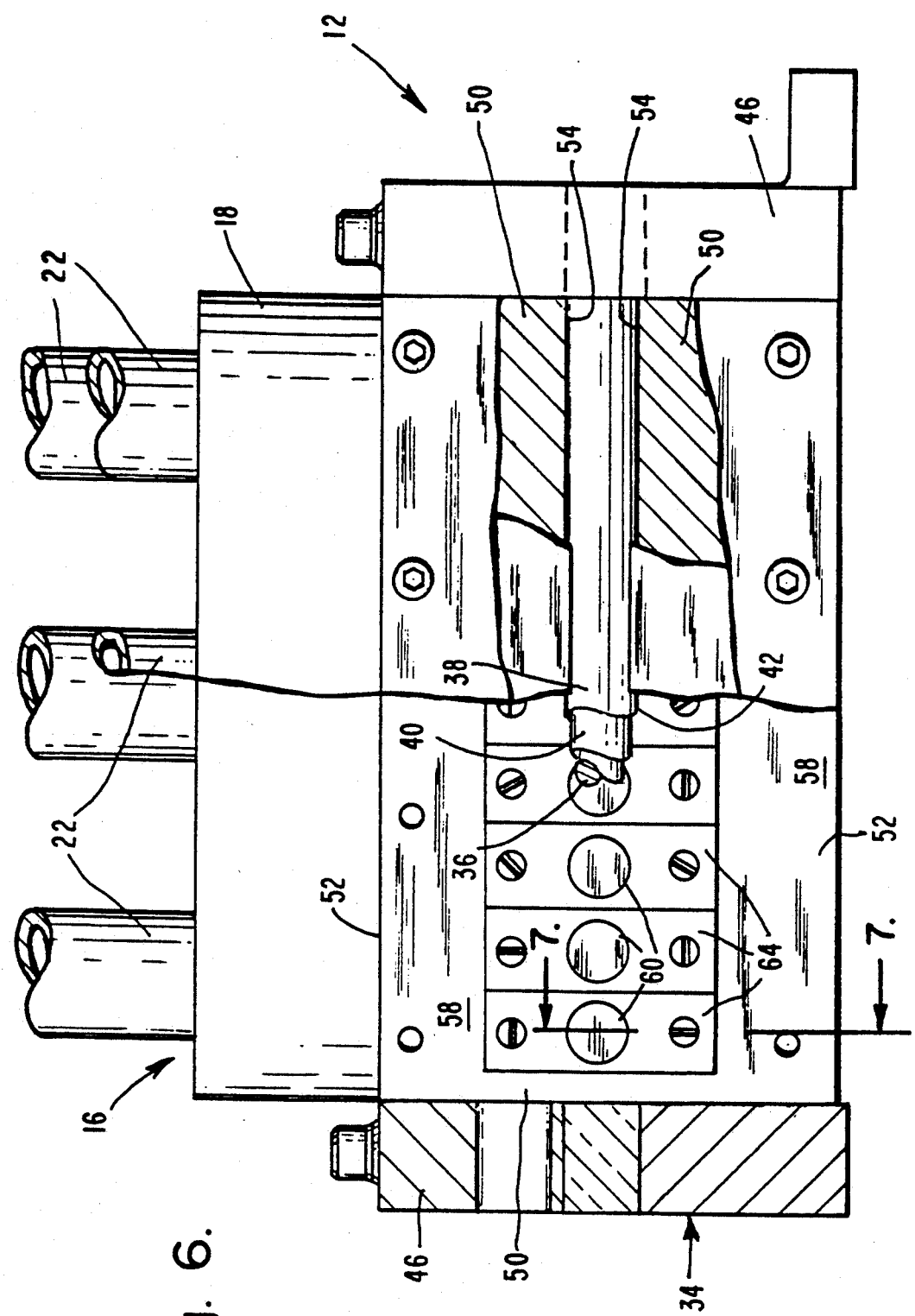
FIG. 6 is view, partially in cross-section and partially cut away, of the laser head depicted in FIG. 2.

Laser rod 36 is supported in housing 34 in any suitable manner, such as by the arrangement disclosed in U.S. Pat. No. 4,637,028, and which is also shown in FIGS. 6 and 7. The FIG. 6 and 7 supporting arrangement depicts a sapphire tube or sleeve 38, an elastomer 40 between sleeve 38 and rod 36, and another elastomer 42 between sleeve 38 and housing 34. The laser rod is encased in sapphire tube 38 and is supported therein by elastomer 40, which comprises a suitable thermally conductive, transparent elastomeric material and which fills a small gap between rod 36 and sleeve 38. A sealant is used as an end seal for sleeve 38. Thus, the elastomer both structurally supports the laser rod and eliminates stress induced bifringence due to thermal expansion of the rod, and additionally maintains thermal contact between the rod and the sapphire sleeve for efficient heat transfer from the rod to the sleeve. Elastomer 42 comprises a suitable thermally conductive material, for example, an aluminum filled elastomer, to ensure that heat generated in laser rod 36 will be conducted to pump housing 34.

More specifically, as shown also in FIGS. 2–5, two piece housing 34 includes a central portion 44 having an I-beam configuration closed and supported by ends 46. The I-beam configuration defines a pair of opposed, outwardly facing U-shaped channels 48 which open at their centers. The two piece construction of housing 34 forms two T-shaped structures whose legs 50 extend towards each other from cross-bars 52 and terminate in curved surfaces 54 that are spaced from one another. Curved surfaces 54 not only thus form a cylindrically shaped opening, which defines the cavity for laser rod 36, but also side openings 56 extending into U-shaped channels 48.

Cross-bars 52 terminate in surfaces 58, to- which evaporator sections 18 of heat pipe assemblies 16 are structurally and thermally secured.

As best illustrated in FIGS. 2, 6 and 7, for each U-shaped channel 48, there are a group of array assemblies. The array assemblies comprise an array 60 of laser diode bars 62 mounted on a mounting block 64, for example of copper, which acts also as a heat spreader. Each assembly is structurally and thermally secured to its associated evaporator section 18. Laser diode arrays 60 are positioned adjacent openings 56 so that the light from the laser diode bars will cause a laser pumping action in laser rod 36. Laser diode bars 62 of arrays 60 may comprise any conventional construction, provided that, as arrays, they provide sufficient energy to obtain stimulated emission in the laser rod. Diode arrays 60 may be replaced with a flash lamp, provided also that it produces sufficient pumping energy.

All parts are secured together in any convenient manner, such as by metal screws, to ensure both a secure physical and thermal engagement.

As disclosed, laser head 12 is configured to provide a two-sided pumping. However, if desired or needed, greater or lesser pumping may be provided. As an example of further or additional pumping, another pair of diode array groups may be positioned 90° with respect to the first pair about laser rod 36. If space does not permit, the second pair may be axially, as well as normally, displaced about the laser rod with respect to the first pair. Accordingly, depending upon the laser pumping needs, laser head can be configured to provide one sided pumping or multiple sided pumping.

Figure 8:
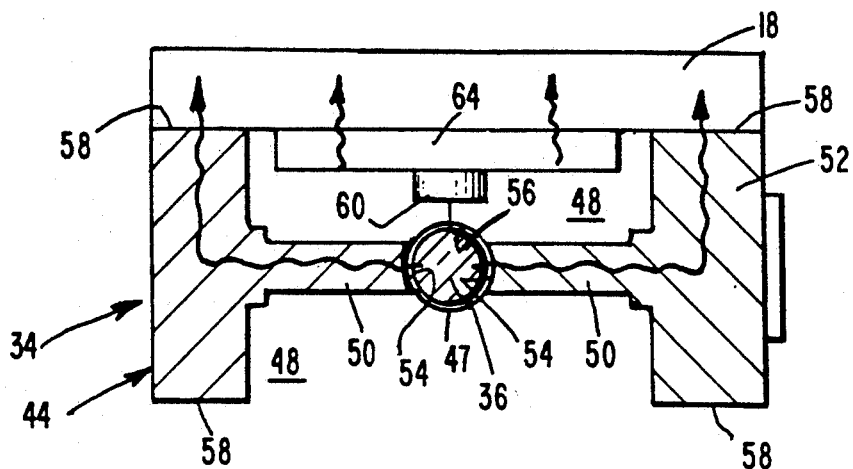
FIG. 8 is a view of a portion of the laser head and heat pipe cooling arrangement therefor illustrating the heat flow from both the laser rod assembly and its pumping diode arrays.

Operation of the present invention may be understood with reference to FIG. 8. Energization of arrays 60 of the laser diode bars pumps light into laser rod 36, causing it to produce stimulated emission. As an adjunct, the temperatures of both the laser diode bars and the laser rod increase. Heat is conducted from rod 36 into legs 50 of pump housing 34 and thence through the four surfaces 58 of cross-bars 52 into evaporator sections 18 of heat pipe assemblies 16. Heat from diode arrays 60 is conducted into heat spreader mounting block 64 and thence also into evaporator sections 18.

Although the invention has been described with respect to a particular embodiment thereof, it should be realized that various changes and modifications may be made therein without departing from the spirit and scope of the invention.

What is claimed is:

1. A solid state laser head and passive cooling means therefor, comprising:
    a laser rod assembly;
    a laser pump cavity including a housing of thermally conductive material in physical support of said laser rod assembly and in thermal contact therewith;
    pumping means positioned adjacent to said laser rod assembly and disposed to stimulate laser emission therein;
    a heat pipe assembly having evaporative means thermally coupled to both said pumping means and said housing; and
    heat spreader and mounting block means in physical support of said pumping means and in thermal contact therewith, wherein said laser pump cavity includes an elongated U-shaped channel which is bounded by ends terminating in interfaces and in which both said pumping means and said mounting block means are positioned and said heat pipe evaporative means being physically and thermally secured both to said heat spreader mounting block means and to said interfaces for removing heat respectively from said pumping means and from said laser rod assembly.

2. A solid state laser head and passive cooling means therefor according to claim 1 in which said pumping means includes an array of laser diode bars.

3. A solid state laser head and passive cooling means therefor according to claim 1 in which:
    said pumping means includes laser diode arrays respectively supported by and in thermal contact with said heat spreader and mounting blocks;
    said laser pump cavity includes a pair of elongated U-shaped channels which are respectively bounded by ends terminating in interfaces and in which said diode arrays and said heat spreader and mounting blocks are respectively positioned; and
    said heat pipe assemblies include a pair of heat pipes having evaporator sections respectively secured in physical and thermal engagement both to said heat spreader and mounting blocks and to said interfaces for removing heat respectively from said pumping means and from said laser rod assembly.

4. A solid state laser head and passive cooling means therefor according to claim 1 wherein said pumping means comprises a plurality of diode bars array assemblies grouped into groups, and further including mounting blocks for physical and thermal support of said diode array assemblies for spreading heat therefrom to said evaporative means.

5. A solid state laser head and passive cooling means therefor according to claim 1 in which said pumping means comprises a flash lamp.

6. A solid state laser head and passive cooling means therefor according to claim 1 in which heat pipe assembly comprises a fixed conductance heat pipe for coupling said cavity housing to a heat sink.

7. A solid state laser head and passive cooling means therefor according to claim 1 in which heat pipe assembly comprises a variable conductance heat pipe for coupling said cavity housing to a heat sink.

8. A solid state laser head and passive cooling means therefor according to claim 1 further comprising heat storage means thermally coupled to condenser means of said heat pipe assembly, and a radiator thermally coupled to said heat storage means.

9. A solid state laser head and passive cooling means therefor according to claim 8 in which said heat storage means includes a phase change material.

10. A solid state laser head and passive cooling means therefor according to claim 9 in which said radiator comprises a space radiator.

11. A solid state laser head and passive cooling means therefor according to claim 10 in which said heat pipe assembly comprises a fixed conductance heat pipe, and further comprising a variable conductance heat pipe thermally coupling said heat storage means to said space radiator.

12. A solid state laser head and passive cooling means therefor according to claim 8 in which said heat pipe assembly comprises a fixed conductance heat pipe, and further comprising a variable conductance heat pipe thermally coupling said heat storage means to said radiator.

13. A method for passively cooling solid state laser heads comprising the steps of:
    positioning pumping means including two diode array assemblies adjacent to a laser rod assembly for enabling stimulated emission thereof;

supporting the laser rod assembly in a laser pump cavity;

configuring the laser pump cavity as an I-beam having two pairs of terminal interfaces respectively bounding a pair of elongated U-shaped channels;

physically and thermally securing each of the heat pipe assemblies at their evaporator sections to respective ones of both the diode array assemblies and the pairs of the terminal interfaces;

physically and thermally supporting each of the diode array assemblies of mounting blocks for spreading heat therefrom to the evaporator sections; and thermally coupling at least one heat pipe assembly to both the pumping means and the laser rod assembly for removing heat from both the pumping means and the laser rod assembly.

14. A method according to claim 13 further comprising the steps of thermally coupling heat storage means to the heat pipe assembly, and a radiator to the heat storage means.

15. A method according to claim 14 further comprising the step of utilizing a phase change material in the heat storage means.

* * * * *